US012812779B2

(12) United States Patent
Higashi et al.

(10) Patent No.: US 12,812,779 B2
(45) Date of Patent: Nov. 24, 2026

(54) WIRING BOARD

(71) Applicant: KYOCERA Corporation, Kyoto (JP)

(72) Inventors: Toshifumi Higashi, Kirishima (JP); Hiroaki Sano, Kagoshima (JP); Akira Imoto, Kirishima (JP); Takafumi Yamaguchi, Kirishima (JP); Sentarou Yamamoto, Kagoshima (JP)

(73) Assignee: KYOCERA CORPORATION, Kyoto (JP)

( * ) Notice: Subject to any disclaimer, the term of this patent is extended or adjusted under 35 U.S.C. 154(b) by 199 days.

(21) Appl. No.: 18/689,496

(22) PCT Filed: Sep. 21, 2022

(86) PCT No.: PCT/JP2022/035265

§ 371 (c)(1),
(2) Date: Mar. 6, 2024

(87) PCT Pub. No.: WO2023/054137

PCT Pub. Date: Apr. 6, 2023

(65) Prior Publication Data

US 2025/0142724 A1 May 1, 2025

(30) Foreign Application Priority Data

Sep. 29, 2021 (JP) ................................ 2021-159610

(51) Int. Cl.
*H05K 1/11* (2006.01)
*H05K 1/03* (2006.01)

(52) U.S. Cl.
CPC .......... *H05K 1/115* (2013.01); *H05K 1/0306* (2013.01); *H05K 1/113* (2013.01);
(Continued)

(58) Field of Classification Search
CPC ...... H05K 1/0306; H05K 1/092; H05K 1/115; H05K 1/116; H05K 1/113; H05K 1/0271; H05K 2201/0209; H05K 2201/0242; H05K 2201/09481; H05K 2201/09618; H05K 2201/068; H05K 2201/09563; H05K 2201/0272; H05K 3/4069; H05K 3/0094; H05K 3/04623
See application file for complete search history.

(56) References Cited

U.S. PATENT DOCUMENTS 4,732,780 A * 3/1988 Mitoff .................. H05K 3/4061 427/125
5,229,549 A * 7/1993 Yamakawa .......... H05K 3/4061 174/262

(Continued)

FOREIGN PATENT DOCUMENTS

JP 2003 101178 A 4/2003
JP 2003-277852 A 10/2003
JP 2008-010605 A 1/2008

*Primary Examiner* — Roshn K Varghese
(74) *Attorney, Agent, or Firm* — Volpe Koenig

(57) ABSTRACT

A wiring board includes an insulation layer made of ceramic, and a via conductor extending through the insulation layer in a thickness direction. The via conductor includes a metal portion and a ceramic portion. The metal portion includes a continuous phase disposed along the thickness direction of the insulation layer in a vertical cross-sectional view.

14 Claims, 4 Drawing Sheets

(52) U.S. Cl.
CPC ................ *H05K 2201/0209* (2013.01); *H05K 2201/0242* (2013.01); *H05K 2201/09481* (2013.01); *H05K 2201/09618* (2013.01)

(56) References Cited

U.S. PATENT DOCUMENTS

| | | | | |
|---|---|---|---|---|
| 6,248,960 | B1 * | 6/2001 | Ami | H01L 23/49883 428/209 |
| 2004/0023011 | A1 * | 2/2004 | Sumi | H01L 23/49883 428/210 |
| 2007/0235694 | A1 | 10/2007 | Nair et al. | |

* cited by examiner

WIRING BOARD

CROSS-REFERENCE TO RELATED APPLICATIONS

This application is national stage application of International Application No. PCT/JP2022/035265, filed on Sep. 21, 2022, which designates the United States, incorporated herein by reference, and which claims the benefit of priority from Japanese Patent Application No. 2021-159610, filed on Sep. 29, 2021, the entire contents of which are incorporated herein by reference.

TECHNICAL FIELD

An embodiment of the present disclosure relates to a wiring board.

BACKGROUND OF INVENTION

A known wiring board includes an insulation layer, an electrical conductor layer containing copper as a main component, and a via conductor. Such a wiring board is obtained by, for example, simultaneously firing an electrical conductor material, obtained by adding a metal oxide to copper powder, and a glass ceramic as an insulation layer material (refer to Patent Document 1, for example).

CITATION LIST

Patent Literature

Patent Document 1: JP 2003-277852 A

SUMMARY

According to an aspect of the present disclosure, a wiring board includes an insulation layer made of ceramic, and a via conductor extending through the insulation layer in a thickness direction. The via conductor includes a metal portion and a ceramic portion. The metal portion includes a continuous phase disposed along the thickness direction of the insulation layer in a vertical cross-sectional view.

DESCRIPTION OF EMBODIMENTS

A known wiring board includes an insulation layer, an electrical conductor layer containing copper as a main component, and a via conductor. Such a wiring board is obtained by, for example, simultaneously firing an electrical conductor material, obtained by adding a metal oxide to copper powder, and a glass ceramic as an insulation layer material.

However, in the related art, there is room for further improvement in increasing an interface electrical conductivity of the via conductor.

As such, a technique that can overcome the aforementioned problem and increase the interface electrical conductivity of the via conductor has yet to be realized.

Hereinafter, embodiments of a wiring board disclosed in the present disclosure will be described with reference to the accompanying drawings. Note that the present invention is not limited by the following embodiments. In the following description, in order to clarify a positional relationship, an X axis, a Y axis, and a Z axis orthogonal to one another are defined, and a Z-axis direction is a thickness direction of an insulation layer.

Wiring Board

Figure 1:
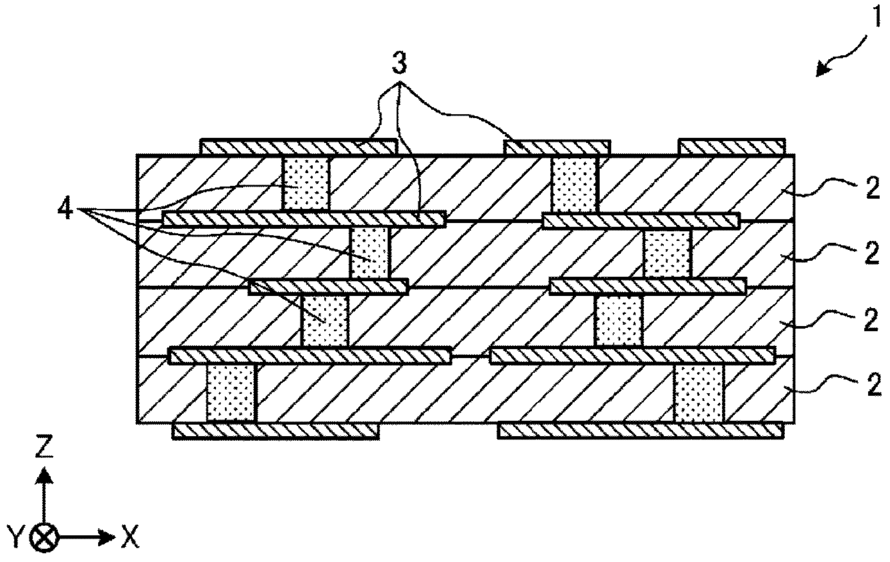
FIG. 1 is a cross-sectional view illustrating an example of a configuration of a wiring board according to an embodiment.

First, a configuration of a wiring board 1 according to an embodiment will be described with reference to FIG. 1. FIG. 1 is a cross-sectional view illustrating an example of the wiring board 1 according to the embodiment. As illustrated in FIG. 1, the wiring board 1 according to the embodiment includes an insulation layer 2, an electrical conductor layer 3, and a via conductor 4.

The insulation layer 2 is made of one ceramic selected from the group consisting of, for example, a glass ceramic sintered body, an aluminum oxide sintered body, an aluminum nitride sintered body, a silicon carbide sintered body, a silicon nitride sintered body, and a mullite sintered body.

The insulation layer 2 may be made of, for example, a glass ceramic. Thus, a green sheet that is the raw material of the insulation layer 2 and an electrically conductive paste that is the raw material of the electrical conductor layer 3 and the via conductor 4 are simultaneously fired to manufacture the wiring board 1. Thus, according to the embodiment, the manufacturing cost of the wiring board 1 can be reduced.

For example, as illustrated in FIG. 1, the wiring board 1 according to the embodiment is configured by layering a plurality of (four in the drawing) insulation layers 2. Note that, in the present disclosure, the wiring board 1 may be constituted by one insulation layer 2.

The electrical conductor layer 3 has electrical conductivity and is disposed in a predetermined pattern shape on a surface of the insulation layer 2 and between the insulation layers 2 adjacent to each other. That is, in the wiring board 1, the insulation layer 2 and the electrical conductor layer 3 are alternately layered.

The electrical conductor layer 3 is made of a metal material such as copper, silver, palladium, gold, platinum, tungsten, molybdenum, or manganese, or a mixed material typified by an alloy material or an intermetallic compound containing the metal material as a main component.

The via conductor 4 has conductivity and is disposed passing through the insulation layer 2 in a thickness direction of the insulation layer 2. The via conductor 4 includes a metal portion 7 (refer to FIG. 5) and ceramic portions 8 (refer to FIG. 5).

The metal portion 7 is made of a metal and, for example, is made of copper, silver, palladium, gold, platinum-tungsten, molybdenum, or manganese. The metal portion 7 may be made of, for example, copper. Thus, the via conductor 4 can have enhanced electrical conductivity.

The ceramic portion 8 is made of ceramic. The ceramic portion 8 may be made of, for example, the same material as at least one of the ceramic materials included in the insulation layer 2.

Thus, the behaviors of thermal shrinkage of the insulation layer 2 and the via conductor 4 can be brought close to each other, and damage to the wiring board 1 due to thermal shrinkage in the simultaneous firing treatment of the wiring board 1 can be reduced.

Via Conductor

Figure 2:
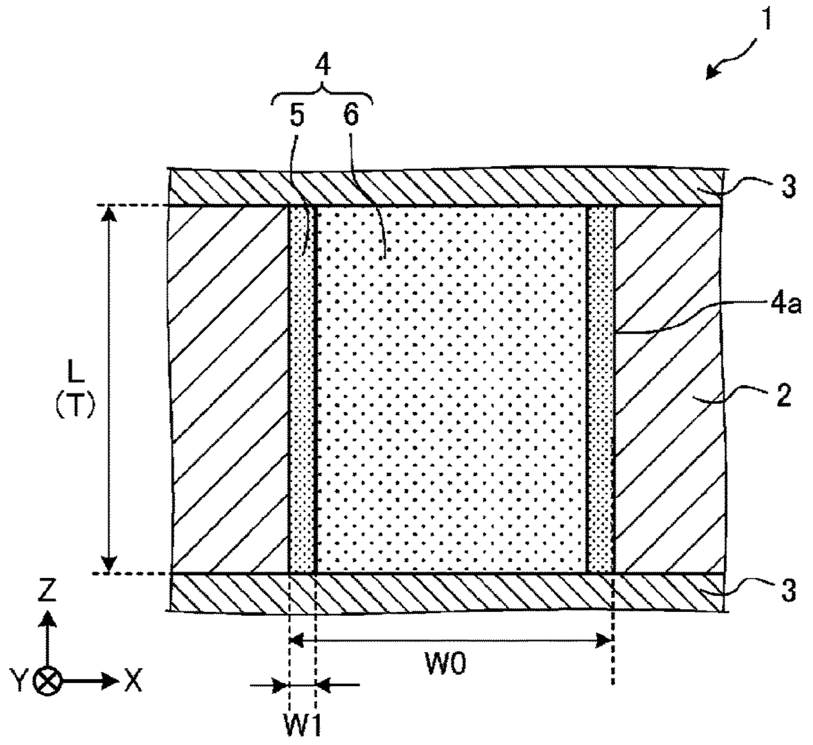
FIG. 2 is a vertical cross-sectional view illustrating an example of a configuration of a via conductor according to the embodiment.

Details of the via conductor 4 according to the embodiment will be described with reference to FIG. 2 to FIG. 4. FIG. 2 is a vertical cross-sectional view illustrating an example of the configuration of the via conductor 4 according to the embodiment, and FIG. 3 is a horizontal cross-sectional view illustrating the example of the configuration of the via conductor 4 according to the embodiment.

Figure 3:
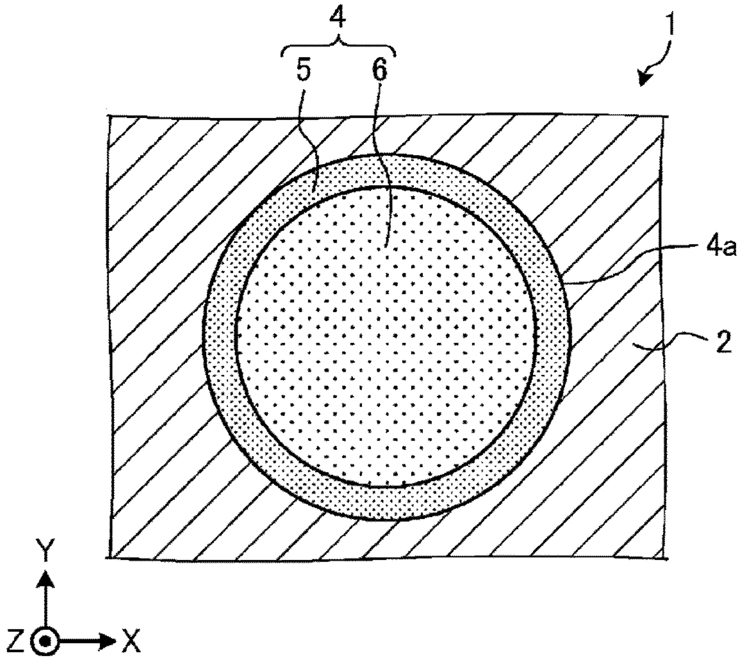
FIG. 3 is a horizontal cross-sectional view illustrating the example of the configuration of the via conductor according to the embodiment.

As illustrated in FIG. 2 and FIG. 3, the via conductor 4 has a pillar shape such as, for example, a substantially cylindrical shape. The via conductor 4 includes a continuous phase 5 and a core portion 6.

The continuous phase 5 is disposed along a side surface 4*a* of the via conductor 4 having a pillar shape, and has a predetermined thickness from the side surface 4*a* toward a center. That is, as illustrated in FIG. 2, the continuous phase 5 has a strip shape having a length L corresponding to a thickness T of the insulation layer 2 in a vertical cross-sectional view.

Figure 4:
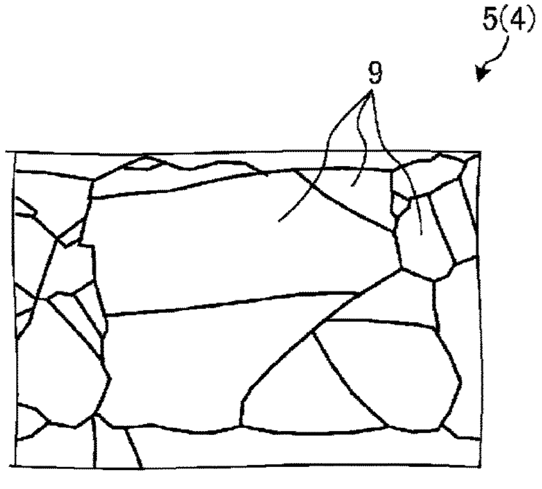
FIG. 4 is a diagram illustrating an example of an arrangement of a crystallite in the via conductor according to the embodiment.

FIG. 4 is a diagram illustrating an example of an arrangement of crystallites 9 in the via conductor 4 according to the embodiment. As illustrated in FIG. 4, in the continuous phase 5, multiple crystallites 9 of metal particles constituting the metal portion 7 (refer to FIG. 5) are present, and the crystallites 9 are continuously connected. That is, the metal portion 7 included in the via conductor 4 includes the continuous phase 5 having a strip shape in a vertical cross-sectional view in the vicinity of the side surface 4*a* (refer to FIG. 2) of the via conductor 4.

Here, the crystallites 9 of the metal particles include those having polygonal shapes in a cross-sectional view. As illustrated in FIG. 4, the plurality of crystallites 9 are in contact with one another at linear sides of the crystallites 9 having polygonal shapes. In the metal portion 7 formed by the crystallites 9 having such polygonal shapes, the crystallites 9 are integrally connected to one another without gaps such as voids or foreign matter such as ceramic particles interposed therebetween.

A method for determining a region of the continuous phase 5 having a strip shape will be described below. Note that the following method for identifying a separation line 5A (refer to FIG. 5) is merely an example. The continuous phase 5 having a strip shape basically refers to a so-called rectangular shape (or oblong shape) having a length equal to that of the thickness direction of the insulation layer 2 as illustrated in FIG. 2 in a vertical cross-sectional view of the via conductor 4, but is not limited thereto, and is intended to include a case in which both side surfaces of the continuous phase 5 have uneven shapes.

In this case, the unevenness is caused by outer shapes of the particles constituting the metal portion 7 and/or the ceramic portions 8 included in the via conductor 4. Accordingly, when an average roughness Ra of both side surfaces of the continuous phase 5 is measured, there may be a portion that is smaller than an average particle diameter of the particles (or crystallites) constituting the metal portion 7 and/or the ceramic portions 8 included in the via conductor 4.

Figure 5:
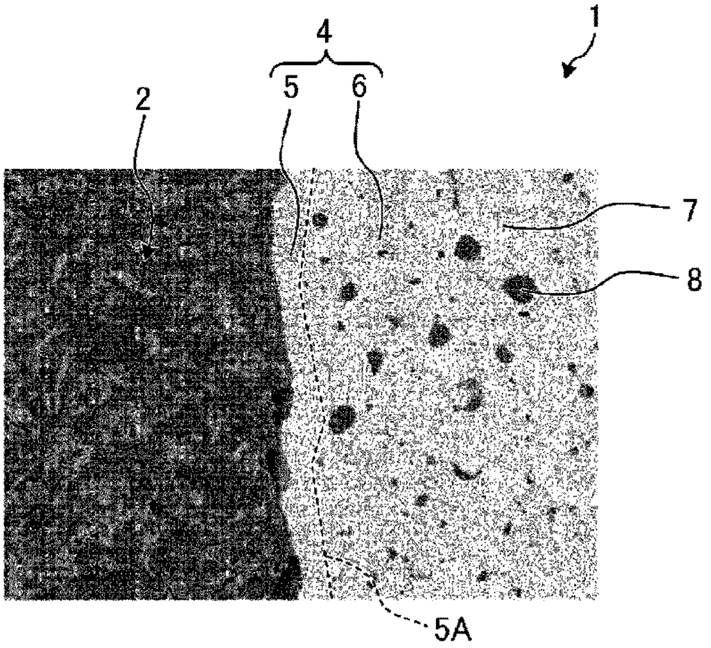
FIG. 5 is a diagram showing an SEM observation photograph of the via conductor according to an example.

Both side surfaces of the continuous phase 5 refer to a surface in contact with the insulation layer 2 and a surface in contact with the core portion 6. When a portion of the continuous phase 5 is specified in the via conductor 4, one side surface of the continuous phase 5 in the width direction is an interface between the continuous phase 5 and the insulation layer 2. The side surface on the opposite side (side surface on the other side) may be provided with the separation line 5A such as illustrated in FIG. 5.

In this case, the separation line 5A is linearly connecting, in the thickness direction, multiple ceramic portions 8 having particle shapes and included in the via conductor 4. As shown in FIG. 5, the position where the separation line 5A is drawn at the ceramic portions 8 is on the continuous phase 5 side of the ceramic portions 8 in a vertical cross-sectional view of the via conductor 4.

That is, the position where the separation line 5A is drawn at the ceramic portions 8 is on the continuous phase 5 side of the ceramic portions 8. In FIG. 5, the position where the separation line 5A is drawn at the ceramic portions 8 is a position of contact with the continuous phase 5 on the left side of the ceramic portions 8. In this case, the ceramic portions 8 selected have an average particle diameter of 200 (nm) or greater.

The ceramic portions 8 having a maximum diameter of 200 (nm) or less may be present in the continuous phase 5. However, in the continuous phase 5, a proportion of the ceramic portions 8 is preferably smaller closer to the insulation layer 2, which is an outer peripheral side of the via conductor 4, than that closer to the core portion 6.

Here, the proportion of the ceramic portions 8 may be a quantity ratio in addition to a volume ratio or an area ratio. This is because a portion close to the insulation layer 2 in the via conductor 4 is a portion where a skin effect is more pronounced at higher frequencies.

Thus, preferably the presence proportion of the ceramic portions 8 is low in the portion of the via conductor 4 near the insulation layer 2. For example, when the continuous phase 5 is divided into two equal parts in the width direction between the interface with the insulation layer 2 and the separation line 5A, the proportion of the ceramic portions 8 is preferably smaller in the portion on the insulation layer 2 side than in the portion on the core portion 6 side.

For example, as illustrated in FIG. 5, even for the ceramic portions 8 minute in size and having a maximum diameter of several (nm) in the continuous phase 5, these ceramic portions 8 minute in size are also preferably present closer to the core portion 6 than to the insulation layer 2. Preferably, the vicinity of an outer periphery of the via conductor 4 has a phase in which the presence of the ceramic portions 8 minute in size and having a maximum diameter of several (nm) is also not recognized.

As illustrated in FIG. 2 and FIG. 3, the core portion 6 is disposed on an inner side of the continuous phase 5 in the via conductor 4 having a pillar shape. In the core portion 6, the metal portion 7 and the ceramic portions 8 (refer to FIG. 5) are mixed.

As described above, in the embodiment, the continuous phase 5 disposed along the thickness direction of the insulation layer 2 is disposed in the via conductor 4 through which a current flows in the thickness direction of the insulation layer 2. Thus, a favorable conductive path can be formed by the continuous phase 5 in the vicinity of the interface between the via conductor 4 and the insulation layer 2.

Thus, according to the embodiment, the via conductor 4 can have increased interface electrical conductivity.

Further, in the embodiment, the length of the continuous phase 5 may be identical to the thickness T of the insulation layer 2 in a vertical cross-sectional view. Thus, an even more favorable conductive path can be formed in an inner portion of the via conductor 4 by the continuous phase 5.

Thus, according to the embodiment, the via conductor 4 can have even further increased interface electrical conductivity.

In the embodiment, as illustrated in FIG. 2, given W0 as an average width of the via conductor 4 and W1 as an average width of the continuous phase 5, W1/W0 may be not less than 0.01 and not more than 0.5. Thus, the width by which the continuous phase 5 extends through the insulation layer 2 in the thickness direction can be increased, and thus the interface electrical conductivity of the via conductor 4 can be further increased.

In the embodiment, as illustrated in FIG. 2, in a vertical cross-sectional view of the via conductor 4, the continuous phase 5 may be disposed at both end portions of the via conductor 4 in the width direction. That is, the embodiment may have a core-shell structure in which the continuous phase 5 is positioned along the interface between the via conductor 4 and the insulation layer 2, and the core portion 6 is positioned on an inner side of the continuous phase 5.

Thus, the electrical conductivity in the vicinity of the interface between the via conductor 4 and the insulation layer 2 can be increased, and thus the interface electrical conductivity of the via conductor 4 in a high-frequency region can be further increased.

Note that, in the present disclosure, an end portion of the via conductor 4 in the width direction refers to a range having a length of not less than 1 (μm) and not more than 10 (μm) from an end of the via conductor 4 in the width direction (that is, the side surface 4*a* of the via conductor 4) toward the inner side of the via conductor 4.

Further, in the embodiment, an area ratio of the metal portion 7 in the inner portion of the via conductor 4 may be 60(%) or greater. Thus, the electrical conductivity of the core portion 6 can also be increased in addition to that of the via conductor 4. As a result, the electrical conductivity of the via conductor 4 as a whole can be increased.

Note that, in this case, an upper limit of the area ratio of the metal portion 7 in the inner portion of the via conductor 4 is 100%, but a ceramic component may be included to increase an adhesion between the via conductor 4 and the insulation layer 2. Accordingly, the upper limit of the area ratio of the metal portion 7 in the inner portion of the via conductor 4 may be 99%. Furthermore, to strongly adhering the entire side surface of the via conductor 4 to the insulation layer 2, the upper limit of the area ratio of the metal portion 7 in the via conductor 4 may be 90% or 80%.

Note that, in the present disclosure, the area ratio of the metal portion 7 in the inner portion of the via conductor 4 is found by A1/A0, where A0 is an area of a region obtained by observing the via conductor 4 in a vertical cross-sectional view and A1 is an area of the metal portion 7 occupying that region.

In the embodiment, the continuous phase 5 of the via conductor 4 may contain a silicon oxide component 10 (refer to FIG. 7) having a size of not less than 10 (nm) and not more than 50 (nm). Thus, the silicon oxide component 10 can increase the adhesion between the continuous phase 5 and the insulation layer 2 made of ceramic and adjacent to the continuous phase 5. Herein, the size refers to the maximum diameter of the silicon oxide component 10 viewed in a cross section of the via conductor 4.

Thus, according to the embodiment, the wiring board 1 can have enhanced reliability. In the embodiment, because this silicon oxide component 10 has a minute size, a decrease in the interface electrical conductivity of the continuous phase 5 can be reduced.

In the embodiment, as illustrated in FIG. 4, the continuous phase 5 may include the crystallites 9 having polygonal shapes. Then, in the embodiment, the crystallites 9 adjacent to one another may be in contact with each other at the sides of the crystallites 9 forming linear shapes as grain boundaries.

Thus, even when the silicon oxide component 10 minute in size is present at the interface between the crystallites 9, a contact surface area between the crystallites 9 can be increased. As a result, the interface electrical conductivity of the via conductor 4 in a high frequency region can be increased.

In the embodiment, the crystallites 9 having a size of not less than 0.5 (μm) and not more than 6.0 (μm) preferably account for 90(%) or more in terms of a quantity ratio.

Note that, in the present disclosure, the crystallites 9 having polygonal shapes are crystallites in which the number of sides forming linear shapes is two or more. In the present disclosure, the crystallites 9 can be observed by analyzing a polished surface by using an electron back scattered diffraction pattern (EBSD) method, for example.

In the embodiment, a relative permittivity of the insulation layer 2 may be not less than 5 and not more than 7. Thus, the via conductor 4 can have increased interface electrical conductivity.

EXAMPLES

Specifically, the wiring boards 1 of an example and a comparative example were fabricated, and differences in various characteristics were evaluated.

As the embodiment, first, a mixture of 40 (wt. %) of alumina particles and 60 (wt. %) of borosilicate glass was prepared as a material of the insulation layer 2. Such a mixture is a glass ceramic raw material having a firing temperature of 900 (° C.) or higher and 1000 (° C.) or lower.

As an organic binder, 20 (parts by mass) of isobutyl methacrylate resin and dibutyl phthalate were used per 100 (parts by mass) of the glass ceramic raw material, and a green sheet having a thickness of 100 (μm) was produced by doctor blade molding.

As raw materials of the via conductor 4, copper powder having an average particle diameter of 2 (μm), borosilicate glass powder having an average particle diameter of 2 (μm), and silica (silicon oxide) particles having an average particle diameter of 20 (nm) were prepared. The silica particles had a proportion of the integrated amount of the lower limit of 10 (nm) and the upper limit of 30 (nm) of 70(%) or more. The copper powder used had a purity of 99.9%.

As the organic binder, a mixed solvent of isobutyl methacrylate resin, butyl carbitol acetate, and dibutyl phthalate was used. A conductive paste containing copper powder, borosilicate glass powder, and silica particles was prepared by adding 5 (parts by mass) of isobutyl methacrylate resin per 100 (parts by mass) of copper powder and further adding a mixed solvent of butyl carbitol acetate and dibutyl phthalate.

The added amounts of the glass powder and the silica particles shown in Table 1 are each a proportion per 100 parts by mass of copper powder.

Note that the reason that the added amount of the glass powder in the sample of the comparative example is as large as 20.5 parts by mass is that, in the case of a via conductor in the related art, a gap is likely to be formed between the via conductor and the insulation layer 2 formed after firing unless a conductor paste to which this amount of the glass powder is added is used.

That is, because the conductive paste of the example contains fine silica particles, the added amount of the glass powder can be reduced. Thus, even with a composition containing a small added amount of glass powder as illustrated in the example, the via conductor 4 having a filling rate high enough for the metal portion 7 to form the continuous phase 5 can be formed.

In this case, the silica particles may be confirmed as present in the via conductor 4 even after the firing.

The area ratio of the silica particles in the cross section of the via conductor 4 is about as much as from 0.002(%) to 0.01(%). Further, the area ratio of the glass phase in the cross section of the via conductor 4 is about 10 times the area ratio of the silica particles, and is, for example, from 0.02(%) to 0.1(%). Thus, the remaining portion in the via conductor 4 is constituted by the metal portion 7 and the ceramic portions 8.

The ceramic portion 8 is a glass ceramic containing, as a precursor, alumina particles and borosilicate glass originally contained in the green sheet for forming the insulation layer 2 after firing. This glass ceramic conceivably moves from the insulation layer 2 side to the via conductor 4 side during firing.

Through-holes were formed in advance in the fabricated green sheet, and the through-holes were filled with the conductor paste by a screen printing method. That is, a conductive paste having a substantially cylindrical shape was printed, extending through the green sheet. The conductive paste was printed with predetermined surface areas on both surfaces of the fabricated green sheet including the through-holes and fired. Thus, a wiring conductor according to the example was yielded.

Such a firing treatment was performed in a reducing atmosphere using a nitrogen-hydrogen mixed gas at a maximum temperature of 930 (° C.) and a holding time of two (hours). A plurality of green sheets were layered to a thickness of 500 (μm).

On the other hand, the wiring board 1 according to the comparative example was fabricated in the same and/or similar manner as the wiring board 1 according to the example described above except that the silica particles were not added to the electrically conductive paste. Note that, in the example and the comparative example, the mixing ratios of the borosilicate glass powder and the silica particles in the electrically conductive paste are the values shown in Table 1 below, and are values appropriately adjusted so that the wiring board 1 was not damaged after the firing treatment.

Here, as shown in Table 1, in comparison with the comparative example in which fine silica particles are not included in the electrically conductive paste, in the example in which the silica particles are included, even when the proportion of the borosilicate glass powder is decreased (that is, the proportion of the copper powder is increased), the wiring board 1 can be formed without being damaged at the time of firing.

The reason for this is presumably as follows. Before the firing treatment, the silica particles of the fine powder adhere to the periphery of the copper powder, whereby a necking start temperature of the copper powder is shifted to a high temperature side. Thus, the necking start temperature of the copper powder that is the main component of the via conductor 4 can be aligned with a necking start temperature of the glass ceramic powder that is the main component of the insulation layer 2.

Accordingly, in the example, by including the fine silica particles in the electrically conductive paste, even when the proportion of the borosilicate glass powder is reduced, the breakage caused by the thermal shrinkage after the firing treatment can be reduced. As shown as the comparative example in Table 1, the via conductor in the related art was fabricated by adding 20.5 parts by mass of borosilicate glass powder.

The obtained wiring board 1 was then cut, and the interface between the insulation layer 2 and the via conductor 4 as well as the vicinity thereof were observed with a scanning electron microscope (SEM). FIG. 5 and FIG. 7 are diagrams showing SEM observation photographs of the via conductor 4 according to the example, and FIG. 6 is a diagram showing an SEM observation photograph of the via conductor 4 of the comparative example.

As shown in FIG. 5, in the example, the continuous phase 5 disposed along the thickness direction of the insulation layer 2 was present in the via conductor 4. The continuous phase 5 had a strip shape and the length L (refer to FIG. 2) corresponding to the thickness T (refer to FIG. 2) of the insulation layer 2.

Note that, in the example, the average width W0 (refer to FIG. 2) of the via conductor 4 was approximately 80 (μm), and the average width W1 (refer to FIG. 2) of the continuous phase 5 was approximately 2 (μm). The range of the continuous phase 5 having a strip shape was determined by adding the separation line 5A to the via conductor 4 imaged in the SEM observation photograph as shown in FIG. 5.

Figure 6:
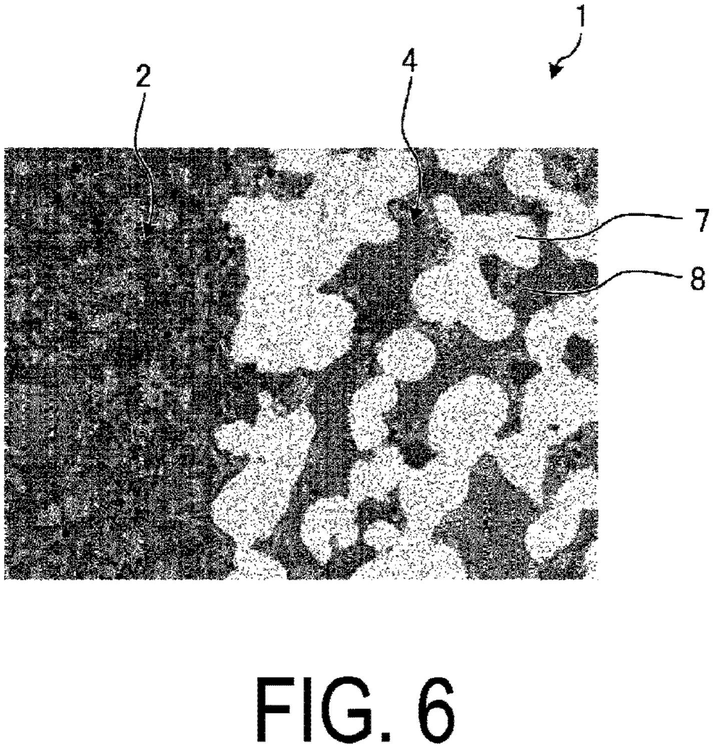
FIG. 6 is a diagram showing an SEM observation photograph of the via conductor in a comparative example.
Figure 7:
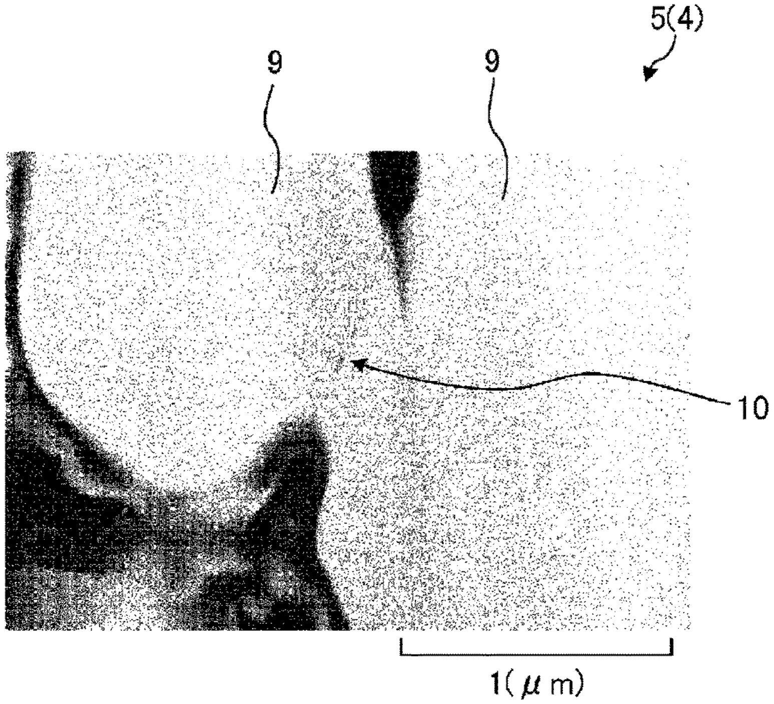
FIG. 7 is a diagram showing an SEM observation photograph of the via conductor according to the example.

On the other hand, as shown in FIG. 6, in the comparative example, the continuous phase 5 having a strip shape was not observed in the via conductor 4.

In the wiring board 1 according to the example, the reason that the continuous phase 5 having the strip shape was formed in the via conductor 4 is presumably as follows. In the firing treatment, the copper powder of the via conductor 4 in contact with the glass ceramic powder of the green sheet has a reduced apparent melting point compared with that of the copper powder of other sites.

In the copper powder of the via conductor 4 in contact with the green sheet, because the copper particles are readily formed into a film shape by the silica particles of the fine powder, the continuous phase 5 having a strip shape is formed.

As shown in FIG. 7, in the via conductor 4 of the wiring board 1 according to the example, the silicon oxide component 10 was observed between the crystallites 9 made of copper and adjacent to each other in the continuous phase 5. Such a silicon oxide component 10 is presumably caused by the silica particles of the fine powder.

Further, the proportion (area ratio) of the metal portion 7 in the via conductor 4 as a whole was obtained using SEM observation photographs of the via conductor 4 for each of the example and the comparative example. Specifically, each obtained SEM observation photograph was converted into a binary image having a predetermined brightness (for example, a brightness of 50%) or greater and less than a predetermined brightness, and the ratio of the number of pixels having the predetermined brightness or greater to the total number of pixels in the binary image was calculated to obtain the area ratio of the metal portion 7.

Next, the interface electrical conductivity of the wiring board 1 in each of the example and the comparative example was measured. This interface electrical conductivity was measured by a cylindrical dielectric resonator method described below.

The method of measuring interface electrical conductivity by using the cylindrical dielectric resonator method is a method of measuring electrical conductivity at the interface between a conductor and an insulation layer, i.e., at the conductor interface, by attaching an insulation layer having the conductor formed therein to both end faces or one end face of a dielectric cylinder made of a dielectric material having known relative permittivity and dielectric loss such that a predetermined relationship is established and thereby forming a dielectric resonator.

The principle of this measurement method is based on the fact that when conductor plates large enough to ignore a cut-edge effect (usually, conductor plates having a diameter D of about three times a diameter d of the dielectric cylinder) are placed in parallel on both end surfaces of the dielectric cylinder having a predetermined dimensional ratio (height h/diameter d) and supported thereon to form an electromagnetic field resonator, a high-frequency current flowing through the conductor plates in the TEomn resonance mode (hereinafter, referred to as the TEomn mode) is distributed only on the short-circuited surface, i.e., the facing surface between the dielectric body and the conductor.

In the dielectric resonator, by using the fact that the high-frequency current flowing through the conductor due to the TEomn mode (m=1, 2, 3, . . . , n=1, 2, 3, . . . ) is distributed only at the interface between the conductor and a dielectric board in contact with the dielectric cylinder, interface electrical conductivity can be calculated from the measured resonance frequencies f0 of the TEomn mode (m=1, 2, 3, . . . , n=1, 2, 3, . . . ) and no-load Q, Qu. The interface electrical conductivity was measured at a frequency of 6 (GHz).

Table 1 shows the added amounts of the glass powder and the silica particles contained in the electrically conductive paste as the material of the via conductor 4, the measurement results of the interface electrical conductivity at the frequency of 6 GHZ, and the measurement results of the proportion of the metal portion 7 in the via conductor 4 for the example and the comparative example. Note that the measurement result of the interface electrical conductivity at a frequency of 6 (GHz) is a relative value given 100(%) as the interface electrical conductivity with direct current.

TABLE 1

| | Example | Comparative example |
|---|---|---|
| Added amount of glass powder | 1.0 (parts by mass) | 20.5 (parts by mass) |
| Added amount of silica particles | 0.3 (parts by mass) | Not added |
| Interface electrical conductivity (6 GHz) | 82 (%) | 20 (%) |
| Proportion (area ratio) of metal portion | 92.0 (%) | 53.8 (%) |

From the comparison between the example in which the continuous phase 5 having a strip shape is disposed in the via conductor 4 and the comparative example in which the continuous phase 5 is not disposed, it is understood that the interface electrical conductivity in the high frequency region of the via conductor 4 is increased by the continuous phase 5 having a strip shape being disposed in the via conductor 4.

Further, from the comparison between the example in which silica particles are added to the electrically conductive paste that is the raw material of the via conductor 4 and the comparative example in which silica particles are not added, the proportion of the metal portion 7 can be increased to 60(%) or more by adding silica particles to the electrically conductive paste.

The embodiment according to the present invention has been described above. However, the present invention is not limited to the embodiment described above, and various modifications can be made without departing from the essential spirit of the present invention. For example, although an example in which a fine powder of silica (silicon oxide) particles is added to an electrically conductive paste that is a raw material of the via conductor 4 has been illustrated in the embodiment described above, the present disclosure is not limited to such an example.

For example, ceramic fine powder other than silica (for example, alumina fine powder) may be added to the electrically conductive paste. In this case as well, the same and/or similar effects as those in the embodiment described above can be obtained.

On the other hand, the adhesion between the insulation layer 2 and the via conductor 4 can be improved by using the fine powder of silica particles, which is the same component as the component contained in the glass ceramic (here, borosilicate glass) of the insulation layer 2, which can enhance the reliability of the wiring board 1.

Additional effects and other aspects can be easily derived by a person skilled in the art. Thus, a wide variety of aspects of the present invention are not limited to the specific details and representative embodiment represented and described above. Accordingly, various changes are possible without departing from the spirit or scope of the general inventive concepts defined by the appended claims and their equivalents.

The invention claimed is:

1. A wiring board comprising:

an insulation layer made of ceramic;

a via conductor extending through the insulation layer in a thickness direction, wherein the via conductor comprises a metal portion and a ceramic portion, and the metal portion comprises a continuous phase disposed along the thickness direction of the insulation layer in a vertical cross-sectional view and comprises a silicon oxide component having a size not less than 10 (nm) and not more than 50 (nm); and wherein an area ratio of the metal portion in an inner portion of the via conductor is not less than 60(%) and not more than 99(%).

2. The wiring board according to claim 1, wherein a length of the continuous phase is identical to a thickness of the insulation layer in a vertical cross-sectional view.

3. The wiring board according to claim 1, wherein W1/W0 is not less than 0.01 and not more than 0.5, where W0 is an average width of the via conductor and W1 is an average width of the continuous phase.

4. The wiring board according to claim 1, wherein the continuous phase is disposed at both end portions of the via conductor in the width direction in a vertical cross-sectional view of the via conductor.

5. The wiring board according to claim 4, wherein an end of the via conductor in the width direction is not less than 1 μm and not more than 10 μm in length from a side surface of the via conductor toward an inside of the via conductor.

6. The wiring board according to claim 1, wherein the continuous phase is positioned near an interface between the insulation layer and the via conductor, extending along the interface.

7. The wiring board according to claim 1, wherein the metal portion has a core-shell structure with a core portion positioned on an inner side of the continuous phase.

8. The wiring board according to claim 1, wherein the continuous phase is located along a side surface of the via conductor having a columnar shape and has a predetermined thickness in a center direction from the side surface.

9. The wiring board according to claim 1, wherein in the continuous phase, there are a plurality of crystallites of metal particles constituting a metal part, and the plurality of crystallites are connected continuously.

10. The wiring board according to claim 1, wherein the metal portion has a banded continuous phase in longitudinal view near a side surface of the via conductor.

11. The wiring board according to claim 1, wherein a ceramic part exists in the continuous phase, and the area ratio of the ceramic part when the via conductor is viewed in cross section is less on an outer peripheral side than on a core side of the via conductor.

12. A wiring board comprising:

an insulation layer made of ceramic;

a via conductor extending through the insulation layer in a thickness direction, wherein the via conductor comprises a metal portion and a ceramic portion, and the metal portion comprises a continuous phase disposed along the thickness direction of the insulation layer in a vertical cross-sectional view; and wherein the continuous phase further comprises crystallites having polygonal shapes, and the plurality of crystallites are tangent to each other on a straight side of a polygonal crystallite, and wherein the continuous phase comprises a silicon oxide component having a size not less than 10 (nm) and not more than 50 (nm).

13. The wiring board according to claim 12, wherein a polygonal crystallite is a crystallite having two or more linear sides.

14. A wiring board comprising:

an insulation layer made of ceramic;

a via conductor extending through the insulation layer in a thickness direction, wherein the via conductor comprises a metal portion and a ceramic portion, and the metal portion comprises a continuous phase disposed along the thickness direction of the insulation layer in a vertical cross-sectional view; and wherein the continuous phase has 90% or more crystallites of 0.5 μm or more and 6.0 μm or less in size, in terms of a quantity ratio.

* * * * *